United States Patent [19]
Unno

[11] Patent Number: 5,933,219
[45] Date of Patent: *Aug. 3, 1999

[54] PROJECTION EXPOSURE APPARATUS AND DEVICE MANUFACTURING METHOD CAPABLE OF CONTROLLING POLARIZATION DIRECTION

[75] Inventor: Yasuyuki Unno, Tochigi-ken, Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/424,967

[22] Filed: Apr. 19, 1995

[30] Foreign Application Priority Data

| Apr. 22, 1994 | [JP] | Japan | 6-107868 |
| Feb. 20, 1995 | [JP] | Japan | 7-055008 |

[51] Int. Cl.⁶ .................................................. G03B 27/72
[52] U.S. Cl. ............................................................. 355/71
[58] Field of Search ............................... 355/53, 67, 71

[56] References Cited

U.S. PATENT DOCUMENTS

| 3,917,399 | 11/1975 | Buzawa et al. | 355/71 X |
| 5,245,470 | 9/1993 | Keum | 359/485 |
| 5,300,972 | 4/1994 | Kamon | 355/71 |
| 5,365,371 | 11/1994 | Kamon | 355/53 X |
| 5,442,184 | 8/1995 | Palmer et al. | 355/71 X |
| 5,467,166 | 11/1995 | Shiraishi | 355/71 |
| 5,627,627 | 5/1997 | Suzuki | 355/53 X |

OTHER PUBLICATIONS

Yasuyuki Unno, "Polarization Effect of Illumination Light", SPIE, vol. 1927, Optical/Laser Microlithography VI, pp. 879–891 (1993).

Koichi Matsumoto, et al., "Issues and Method of Designing Lenses for Optical Lithography", Optical Engineering, vol. 31, No. 12, pp. 2657–2664 (Dec. 1992).

Primary Examiner—Fred L Braun
Attorney, Agent, or Firm—Fitzpatrick, Cella Harper & Scinto

[57] ABSTRACT

In a projection apparatus and method, a mask and a substrate are scanned relative to an exposure beam in a scanning direction, with the exposure beam having a direction of polarization. The mask contains at least first and second patterns, with the first pattern extending in a different longitudinal direction than the second pattern, and the first and second patterns being formed at different positions with respect to the scanning direction. The direction of polarization of the exposure beam is changed during the scanning operation so that each of the first and second patterns is exposed to a polarized light beam which is polarized in the same direction as the longitudinal direction of the pattern.

22 Claims, 11 Drawing Sheets

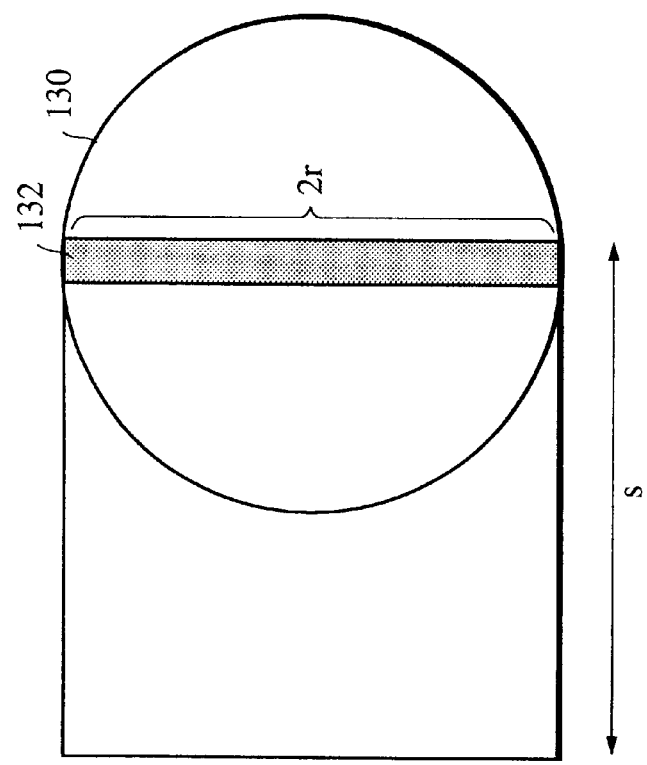
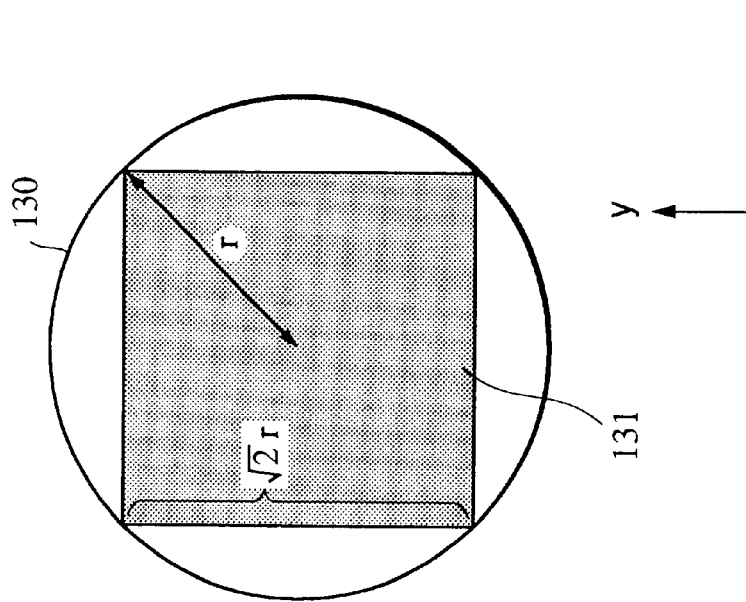

PROJECTION EXPOSURE APPARATUS AND DEVICE MANUFACTURING METHOD CAPABLE OF CONTROLLING POLARIZATION DIRECTION

BACKGROUND OF THE INVENTION

1. Field of the Invention

The present invention relates to a projection exposure apparatus and a device manufacturing method employing the same, which are suitable for use in a lithographic process in the device manufacturing processes for semiconductor devices, such as ICs or LSIs, imaging devices, such as CCDs, display devices, such as liquid crystal panels, and other devices such as magnetic heads.

2. Description of the Related Art

In recent years, an increase in the number of components per IC or LSI chip, forming a semiconductor device, has been increased. So far as a reduction projection exposure apparatus (stepper) for sequentially exposing a large number of areas on a photosensitive substrate by the step and repeat method by repeating formation of a circuit pattern image of a mask (reticle) on the photosensitive substrate by a projection optical system is concerned, various proposals have been made to improve resolution thereof.

Conventional examples of such resolution improving methods include a method of shortening the exposure wavelength, a method of increasing an aperture (NA) of a projection lens, a phase shifting method of improving the resolution by partially inverting the phase of a light which transmits through a cyclic pattern and a modified illumination method of improving the resolution by illuminating a cyclic pattern obliquely.

In addition, the method of improving the resolution by controlling the polarized state of light which illuminate a pattern is also known. The theoretical relation between the polarization of illuminating light which illuminate a pattern and the resolution has been described in detail in, for example, Optical Engineering, Vol. 31 (1992) p. 2657, and SPIE Vol. 1927 (1993) p. 879.

To obtain a high resolution power, for example, in a cyclic pattern 101 shown in FIG. 5 by controlling the polarized state of illumination light, linearly polarized light polarized in a direction parallel to the longitudinal direction of the respective patterns, indicated by a bidirectional arrow 102, is employed as the illumination light.

It is, however, to be noted that the use of the linearly polarized light as the illumination light for illuminating the patterns is not requisite, and the use of linearly polarized light polarized in a direction parallel to the longitudinal direction of the images of the patterns as light used to form the images of the patterns when the image of the patterns are formed is substantially essential.

The method of improving the resolution by controlling the polarized state of the illumination light falls into a method of illuminating a pattern with polarized light obtained by providing a polarizing film immediately before the pattern on a reticle and a method of providing a desired linearly polarized light obtained by rotating a polarizing plate. In the former method, if patterns 103, 104 and 105 directed in various directions, shown in FIG. 6, are available as patterns on a reticle, polarizing films 109, 110 an 111 for transmitting polarized components directed in directions indicated by bidirectional arrows 106, 107 and 108 therethrough are provided according to the patterns to improve the resolution. In the latter method, the direction of polarization of the light which has transmitted a polarizing plate 120 is restricted to a direction indicated by a bidirectional arrow 121, as shown in FIG. 7.

Generally, a reticle has thereon cyclic patterns directed in various directions, and the resolution of patterns, such as a pattern 122, whose longitudinal direction coincides with the direction of polarization can be improved because the longitudinal direction of the image of the pattern formed on an image plane is parallel to the direction of polarization.

However, regarding the patterns directed in directions other than the direction indicated by 121, an improvement in the resolution cannot be expected. Particularly, the resolution of a pattern, such as a pattern 123, whose longitudinal direction is perpendicular to the direction of polarization deteriorates when compared to that obtained when a normal non-polarized illumination light is used.

SUMMARY OF THE INVENTION

An object of the present invention is to provide a projection exposure apparatus utilizing polarization which exhibits a high resolution, and a device manufacturing method utilizing polarization.

The projection exposure apparatus according to the present invention comprises scanning means for scanning a mask and a substrate relative to an exposure beam, and polarization changing means for changing a direction of polarization of the exposure beam during the scanning operation.

The device manufacturing method according to the present invention comprises the step of printing a device pattern of a mask onto a substrate using the above-described projection exposure apparatus.

BRIEF DESCRIPTION OF THE DRAWINGS

FIGS. 8(A) and 8(B) illustrate an exposure area in the step and scanning method.

Figure 1:
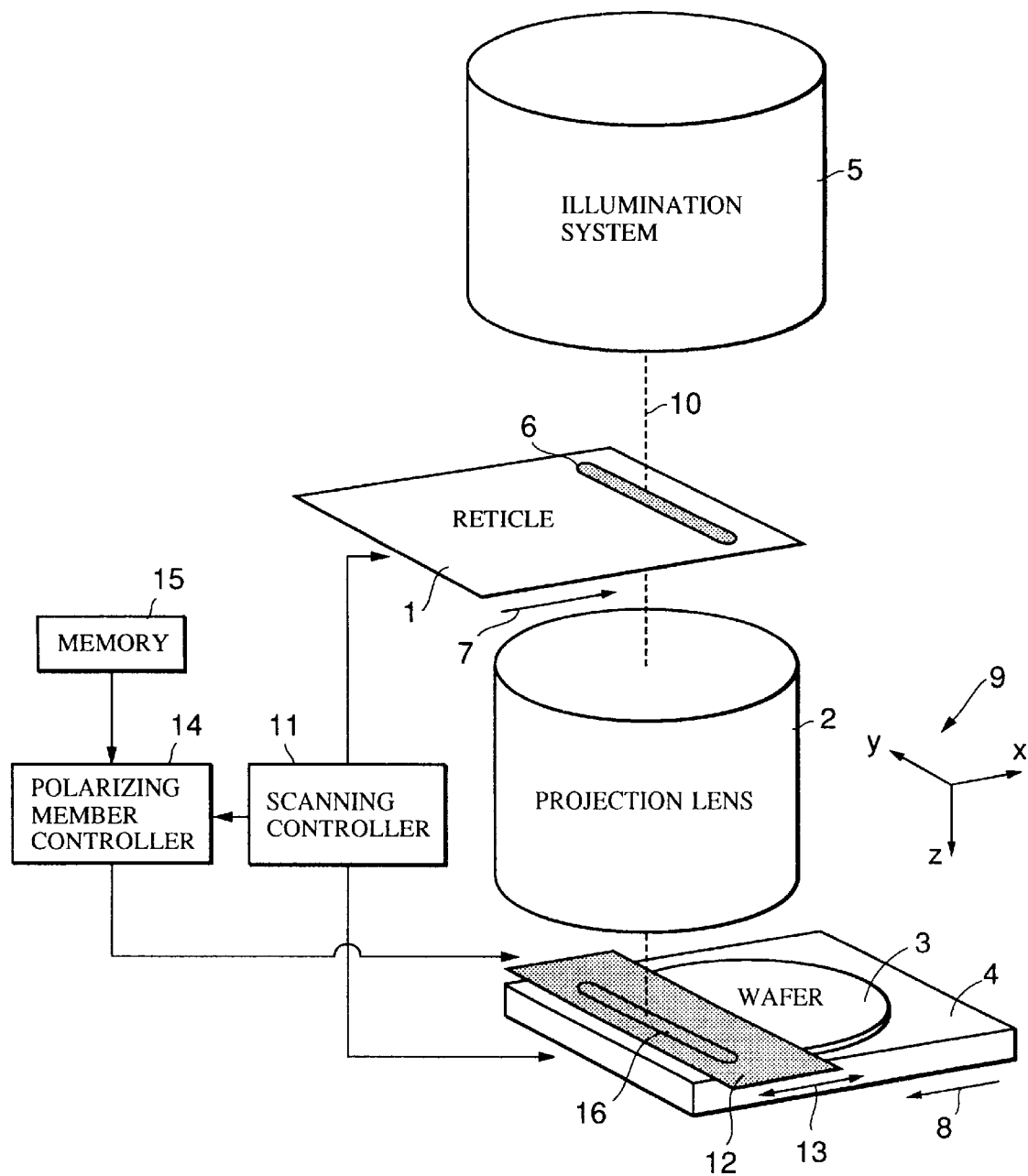
FIG. 1 is a schematic view of the essential parts of a first embodiment of the present invention.
Figure 9:
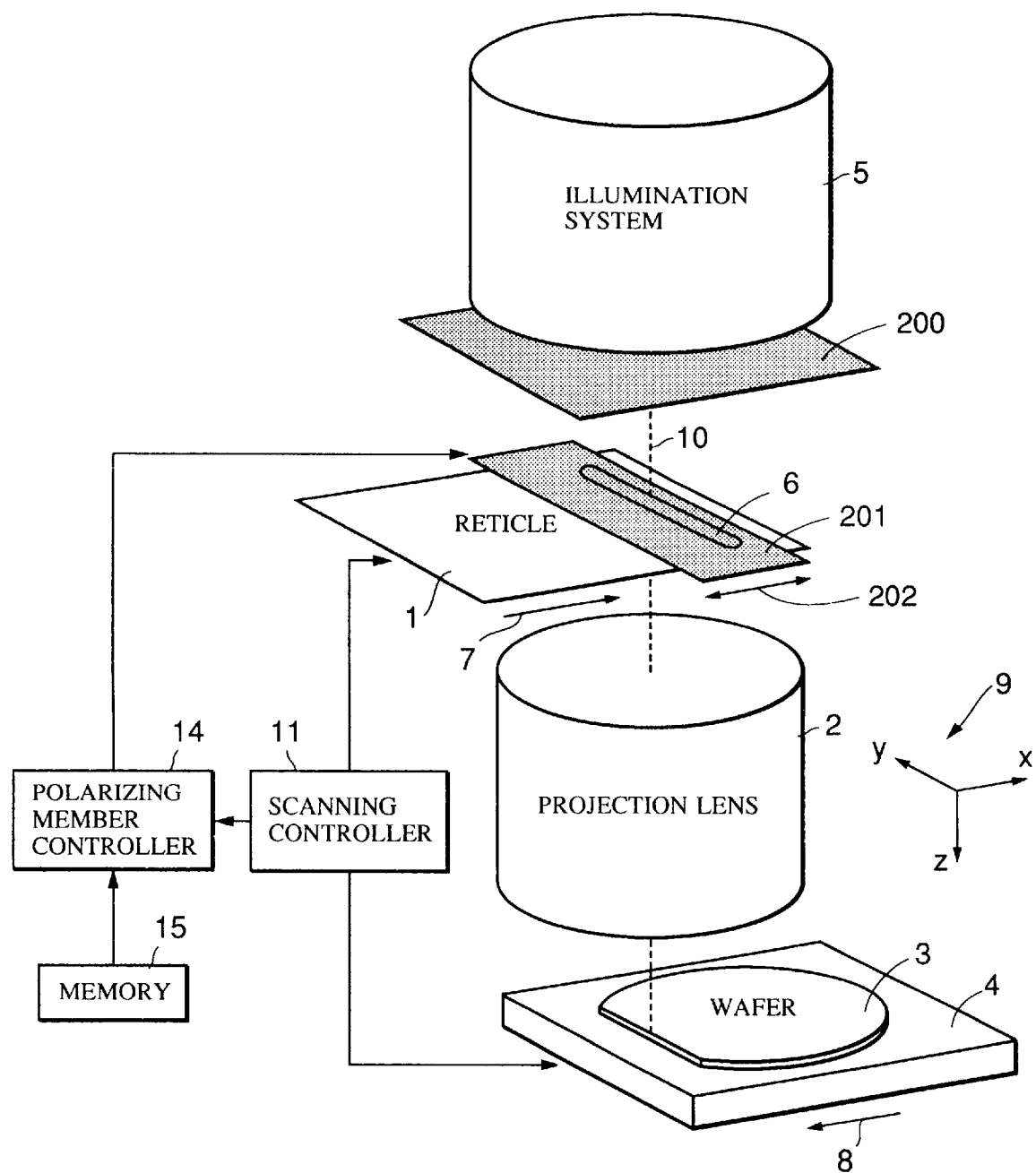
FIG. 9 is a schematic view of the essential parts of a second embodiment of the present invention.

Each of the elements shown in block outline in FIG. 1, as well as in FIG. 9, is well known per se and a specific type of construction is not critical to carrying out the invention or to a disclosure of the best mode for carrying out the invention.

DETAILED DESCRIPTION OF THE PREFERRED EMBODIMENTS

FIG. 1 is a schematic view of the essential parts of a first embodiment of the present invention. The projection exposure apparatus shown in FIG. 1 is of the step and scanning type which employs a scanning mechanism so that it can expose a wider exposure area than that of a normally employed stepper having no scanning mechanism.

Figure 2:
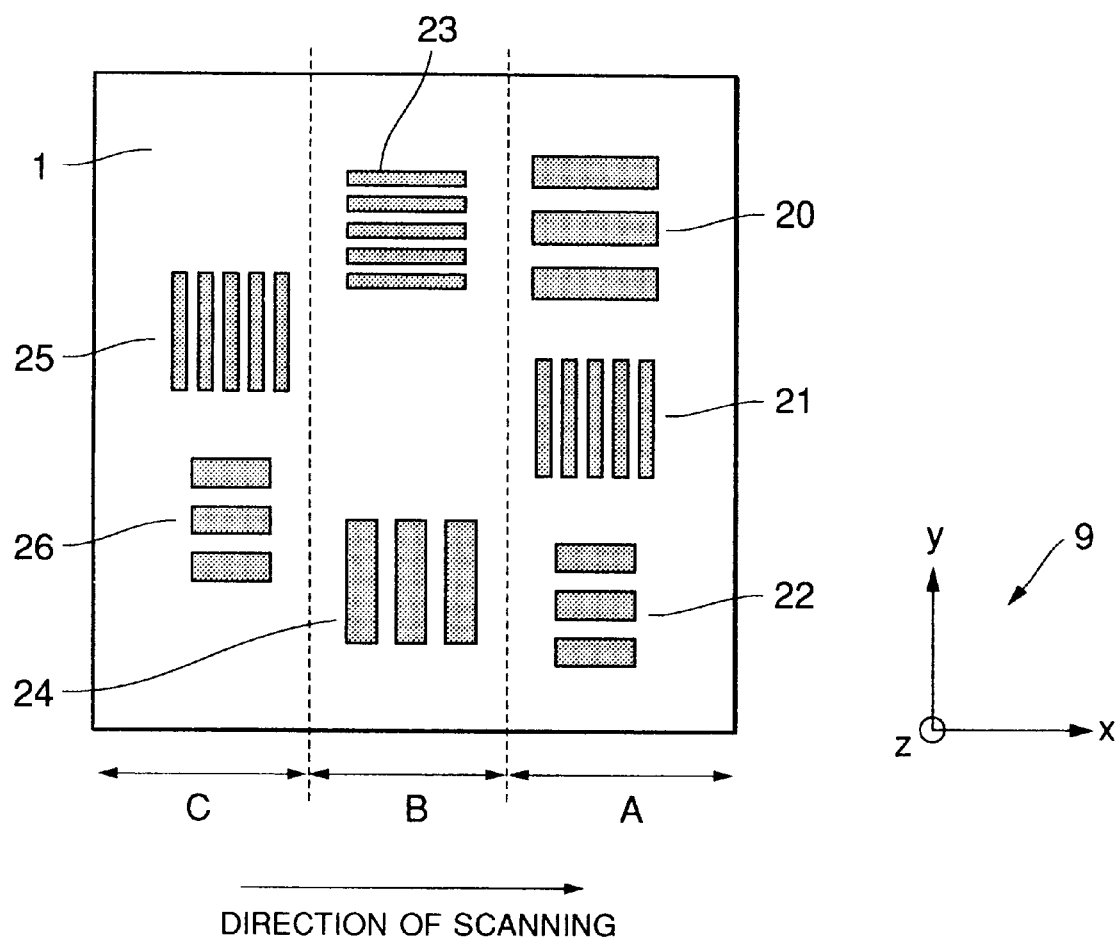
FIG. 2 illustrates a reticle shown in FIG. 1.

A reticle 1 (mask) has, which is a first object, circuit, or scanning patterns, such as areas A, B and C shown in FIG. 2, on a surface thereof along the direction of scanning. A projection lens (projection optical system) 2 is provided between the reticle 1 and a movable stage 4 on which a wafer 3, which is a second object, is placed. A resist of the type which reacts with ultraviolet radiations is coated on the surface of the wafer 3. An illumination system 5 radiates a slit-shaped illumination ray 6.

In this embodiment, the slit-like illumination ray 6 is obtained either by providing a slit-shaped aperture (slit opening) immediately before the reticle 1 or by providing an aperture (slit opening) similar to that provided immediately before the reticle 1 in the illumination system 5 at a position optically conjugate with the reticle 1.

Reference 9 denotes an x-, y- and z-axis coordinate system. In the present embodiment, an optical axis 10 of a projection lens 2 is parallel to the z-axis of the coordinate system 9, the longitudinal direction of the slit-shaped illumination ray 6 is parallel to the y-axis, and the lateral direction of the illumination ray 6 (the direction in which the reticle 1 and the stage 4 (wafer 3) are scanned) is parallel to the x-axis.

Figure 3:
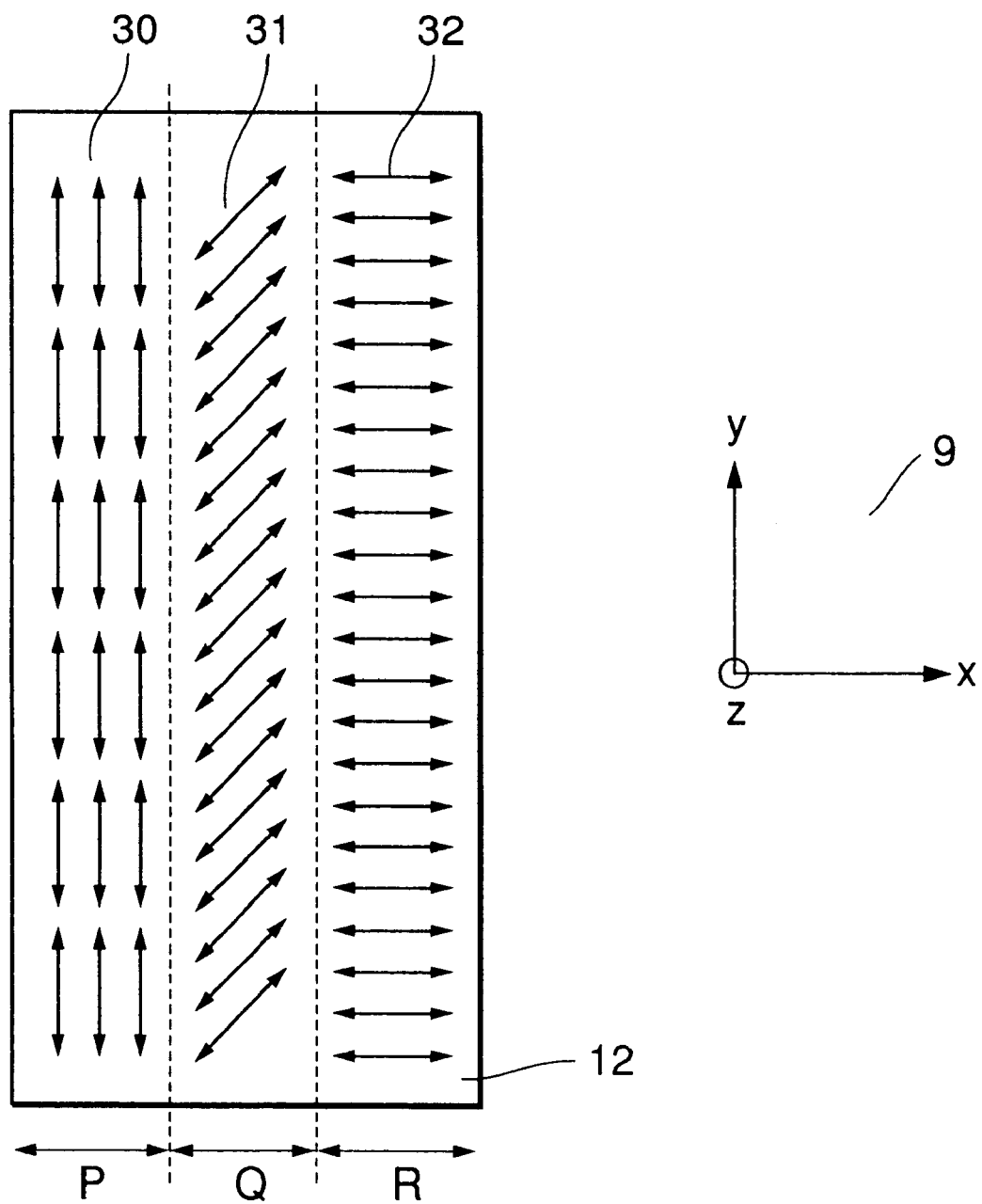
FIG. 3 illustrates a polarizing member shown in FIG. 1.

A polarizing member 12, which is polarization changing means, is provided immediately before the wafer 3. As shown in FIG. 3, the polarizing member 12 has a plurality of polarizing areas (polarizers) P, Q and R to change the direction of polarization of a transmitted light ray into different directions. A polarizing member controller 14 controls the polarizing member 12 on the basis of signals from both a scanning controller 11 and a memory 15 in the manner described later. A pattern image is formed by the slit-shaped illumination ray in an image formed area 16.

In this embodiment, the light ray emanating from the projection lens 2 passes through a desired polarizing area selected from the areas P, Q and R of the polarizing member 12 provided immediately before the wafer 3 and is thereby changed into a predetermined linearly polarized light ray. An image of the circuit pattern on the reticle 1 is formed on the wafer 3 using the thus-obtained linearly polarized light ray so as to achieve exposure of the wafer 3.

In the structure shown in FIG. 1, since the pattern on the reticle 1 to be projected and transferred onto the wafer 3 is only the pattern formed on the portion of the reticle 1 illuminated with the slit-shaped illumination ray 6, the reticle 1 is moved at a predetermined speed in the direction indicated by an arrow 7 while the stage 4 is moved at a speed which is a product obtained by multiplying the speed of the reticle 1 by an imaging magnification of the projection lens 2, whereby the entire circuit patterns on the reticle 1 are projected and transferred onto the wafer 3.

Synchronous movement of the reticle 1 and wafer 3 is controlled by the scanning controller 11. After all of the circuit patterns have been transferred, the stage 4 is moved, i.e., stepped, by a predetermined amount so that pattern transfer can be repeated on different positions on the wafer 3. After exposure of the entire wafer 3 is completed, the wafer 3 is subjected to a known development process, whereby a semiconductor device is manufactured.

The reason why the step and scanning type exposure apparatus can expose a wider exposure area on the wafer than that of the normally employed stepper type apparatus (in which no scanning is performed) will now be described with reference to FIG. 8.

The range in which aberration of the projection lens is excellently corrected can be an exposure area. Hence, if it is assumed that the range in which the aberration of the projection lens is corrected is represented by a circle 130 (radius: r) shown in FIG. 8(A) and that the circuit patterns are within a square range, the exposure area is a maximum square inscribed by the circle 130, i.e., a square whose side has line segments of a length of $\sqrt{2}r$. The exposure area obtained by the normally employed stepper is the area $2r^2$ of that square. In this embodiment, the x- and y axes of the coordinate system coincide with the directions of the two perpendicular sides of the square 131 shown in FIG. 8(A).

Where the shape inscribed by the circle 130 representing the range in which aberration is corrected is not a square but a rectangle, as shown in FIG. 8(B), the length of the long side (the y-axis direction) of a rectangle 132 is close to 2r. In the pattern transfer conducted by scanning the circuit patterns in the x-axis direction in the rectangle 132, if the length that can be scanned is s, the exposure area is determined by an area 2rs, which is larger than the area $2r^2$. This is why a wide exposure area can be obtained in the step and scanning method.

The optical function of the polarizing member 12 employed in this embodiment will now be discussed. The polarizing member 12 is provided in such a manner as to be movable back and forth in directions indicated by a bidirectional arrow 13. The polarizing member controller 14 controls the movement of the polarizing member 12 on the basis of the signals from both the scanning controller 11 and the memory 15.

In the reticle 1 in which patterns 20 through 26 are formed thereon, as shown in FIG. 2, since the reticle 1 is within a xy plane, the resolution of the patterns 21, 24 and 25 is improved if a light linearly polarized in the y direction is used when the images of the patterns 21, 24 and 25 are formed on the wafer 3. Regarding the patterns 20, 22, 23 and 26, the resolution thereof is improved when the images thereof are formed on the wafer by using a light ray linearly polarized in the x direction, as mentioned above.

Regarding the range A containing the patterns 20, 21 and 22, since the patterns 20 and 22 have a large pitch, a sufficient resolution can be obtained even if the polarization on the wafer 3 will not be optimized.

Hence, in this embodiment, to improve the resolution of the entire range A, the light linearly polarized in the y direction is used when the pattern image is formed on the wafer 3 to improve the resolution of the pattern 21 having the minimum pitch. Similarly, to improve the resolution of the range B, the light linearly polarized in the x direction is used when the pattern image is formed on the wafer 3 with the resolution of the pattern 23 taken into consideration. Regarding the range C, the light linearly polarized in the y direction is used when the pattern image of the range C is formed on the wafer 3 with the pattern 25 taken into consideration. In this way, the optimum resolution can be obtained over the entire patterns of the reticle 1.

That is, in the present invention, the polarized state of the light ray used to form a pattern image is varied by the polarizing member 12 according to the position of both the reticle 1 and the wafer 3 when the reticle 1 and the wafer 3 are moved.

FIG. 3 illustrates the polarized states (directions) of the respective polarizing areas P, Q and R of the polarizing member 12 according to the present invention. The polarizing member 12 has three areas (ranges) P, Q and R. The area P polarizes the light which transmits therethrough in a direction indicated by bidirectional arrows 30. The area Q polarizes the light which transmits therethrough in a direction indicated by bidirectional arrows 31. The area R polarizes the light which transmits therethrough in a direction indicated by bidirectional arrows 32. The entire polarizing member 12 has coordinate axes indicated by 9, and is provided immediately before the wafer 3 parallel to the reticle 1.

FIG. 4 illustrates the positional relation between the scanning of the wafer 3 and the polarizing areas of the polarizing member 12. In FIG. 4, reference numeral 40 denotes an area (range) on the wafer 3 onto which the entire pattern on the reticle 1 shown in FIG. 2 is transferred.

It is assumed in this embodiment that the reticle 1 is moved in the positive direction of the x axis while the area 40 on the wafer 3 is moved in the negative direction of the x axis, and that the images of the patterns present on the areas A, B and C on the reticle 1 are respectively formed on ranges A', B' and C' of the range 40.

Figure 4A:
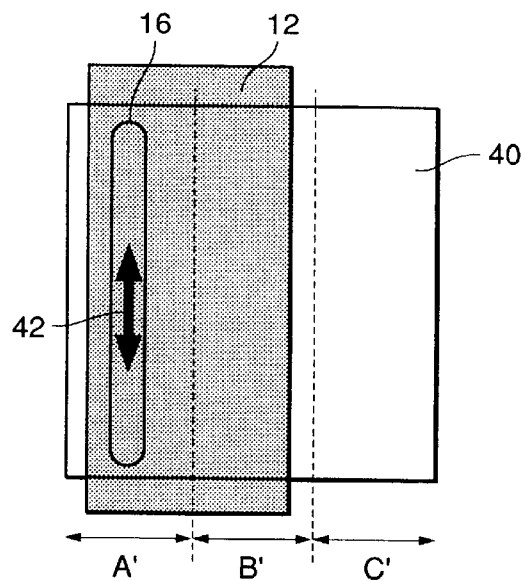
FIGS. 4(A) to 4(C) illustrate the operation of the first embodiment.

When scanning is started and the pattern on the range A of the reticle 1 shown in FIG. 2 is illuminated with the slit-shaped illumination ray 6, the image of the pattern on the area A is formed on the image forming area 16 in the range A' of the range 40 on the wafer 3, as shown in FIG. 4(A). At that time, since the optimum resolution is obtained by forming the pattern image using a light 42 linearly polarized in the y direction, the polarizing member 12 is moved to the right so that the portion indicated by the range P shown in FIG. 3 can be overlapped on the image forming area 16.

Figure 4B:
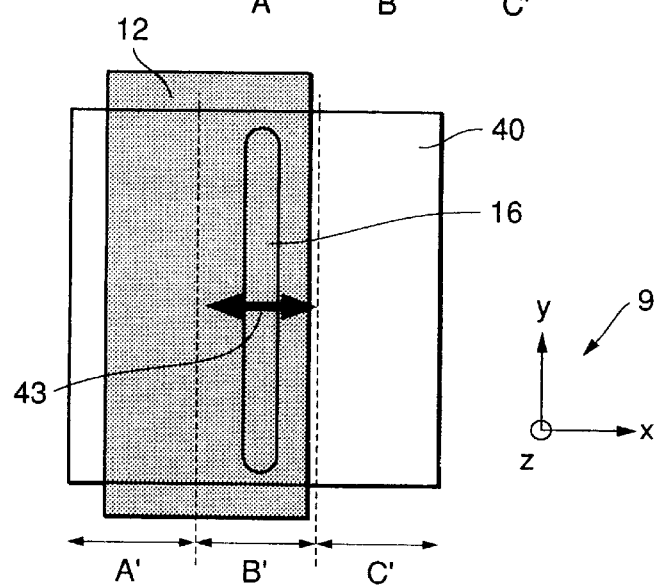

Next, as scanning of the reticle 1 progresses and the area B shown in FIG. 2 is illuminated, the image of the pattern on the range B is formed at the position of the range B', as shown in FIG. 4(B). At that time, since the optimum resolution is obtained using a light 43 linearly polarized in the x direction, the polarizing member 12 is moved to the left so as to superimpose the portion thereof indicated by the range R shown in FIG. 3 on the image forming area 16.

Figure 4C:
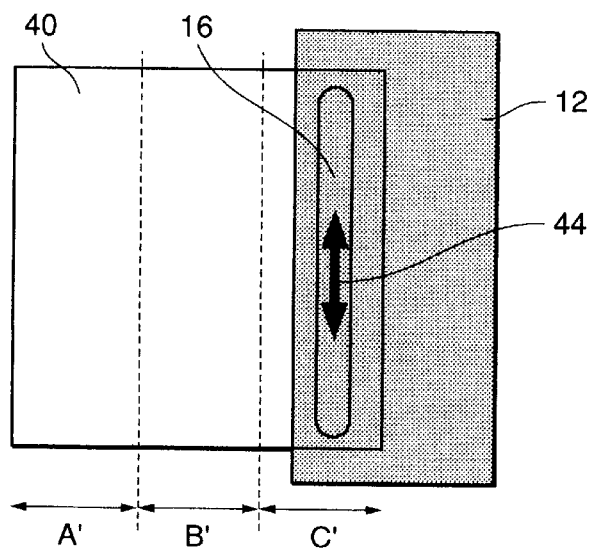
Figure 5:
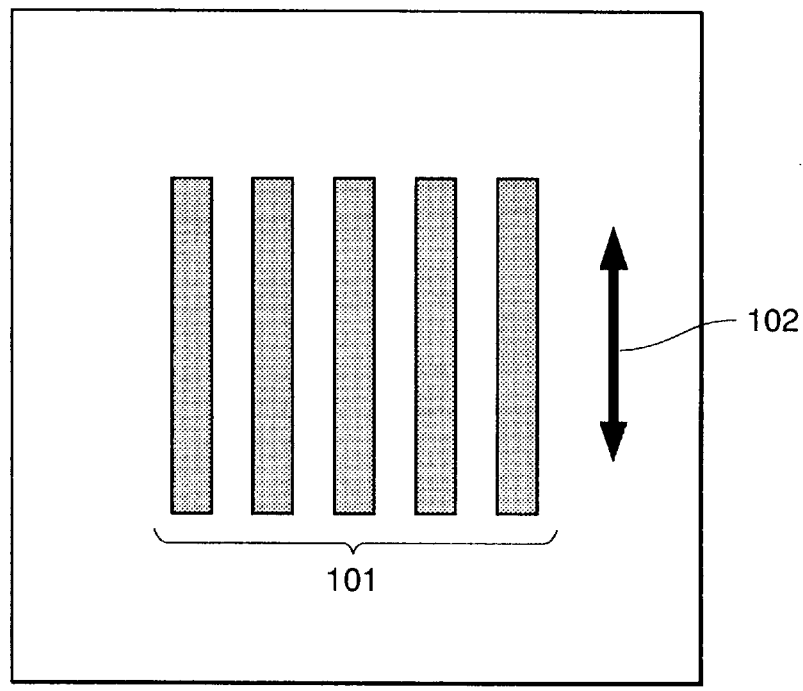
FIG. 5 illustrates the relation between a pattern and a direction of polarization.
Figure 6:
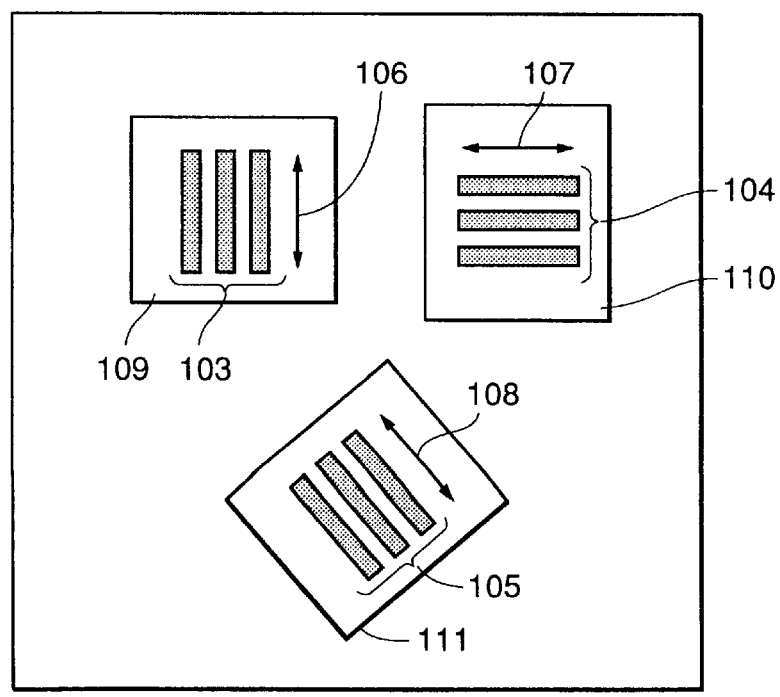
FIG. 6 illustrates the relation between patterns and directions of polarization.

As scanning of the reticle 1 further progresses and the area C shown in FIG. 2 is illuminated, the image of the pattern on the area C is formed at a position of the range C', as shown in FIG. 4(C). At that time, since the optimum image can be obtained using a light 44 linearly polarized in the y direction, the polarizing member 12 is moved to the right again to superimpose the portion thereof indicated by the range P shown in FIG. 3 on the image forming area 16.

The above-described series of operations are repeated, whereby the images of the patterns on the reticle 1 can always be projected onto the wafer 3 in an optimum polarized state.

In this embodiment, the portion indicated by the range Q shown in FIG. 3, having a direction of polarization which is intermediate between the direction of the range P and that of the range R, is interposed between the ranges P and R so that switch over of the direction of polarization will not occur abruptly when the direction of polarization of the light which reaches the image forming area 16 is varied by displacing the polarizing member 12.

The actually employed procedures of the exposure operation will now be described. First, both the coordinates of the positions of the transferred circuit patterns in the direction of scanning and the optimum polarized states of the light for forming images of the patterns present at the coordinates of the respective positions are stored in the memory 15 before exposure is started. At that time, the optimum polarized state for the coordinate of each position is selected so that the resolution of the pattern having the minimum pitch at that coordinate of the position can be improved, as has been discussed with reference to FIG. 2. Alternately, the optimum polarized state determined from the conditions other than those mentioned above may be stored in the memory 15.

The scanning controller 11 performs scanning exposure by controlling both the reticle 1 (in an actual operation, a reticle stage) and the stage 4, and transmits data on the scanning positions of both the reticle 1 and the wafer 3 to the polarizing member controller 14. The polarizing member controller 14 performs control on the polarizing member 12 on the basis of both the signal from the scanning controller 11 and the data from the memory 15, as mentioned above. The scanning controller 11 forms data on the positions of both the reticle 1 and the wafer 3 by counting the time which starts from the scanning starting point or on the basis of a signal from a position measuring device, such as a laser interferometer or an encoder. The polarizing member controller 14 has a microcomputer for controlling a linear motor which is not shown. The linear motor can move the polarizing member 12 back and forth with respect to the direction of scanning.

The polarizing member 12 while shown in FIG. 3 as being divided into three areas in the x direction in which the direction of polarization of the right end is perpendicular to the direction of polarization of the left end, alternate embodiments of the invention might contemplate a polarizing member having a structure other than that described above, e.g., a polarizing member in which there are variations in the directions of polarization in the y direction, unlike the polarizing member shown in FIG. 3 in which the directions of polarization are uniformly distributed.

While the polarizing member 12 is provided in this embodiment immediately before the wafer 3, it is substantially essential to obtain the above-described polarized state of the light when an image of a pattern is formed, as mentioned above.

In that sense, the position of the polarizing member 12 may be within the illumination system 5, between the illumination system 5 and the reticle 1, between the reticle 1 and the projection lens 2 or within the projection lens 2.

A second embodiment of the present invention will be described below.

FIG. 9 is a schematic view of a step and scanning type projection exposure apparatus according to the second embodiment of the present invention. Since the major structure and operation of the apparatus are the same as those of the first embodiment, only the differences between the first and second embodiments will be discussed below.

In the second embodiment, the illumination ray emitted from the illumination system 5 is converted into a linearly polarized light by a polarizing plate 200. That is, the slit-shaped illumination ray 6 for illuminating the reticle 1 is a linearly polarized light. Further, a polarizing member 201, which will be described in detail later, is provided immediately before the reticle 1 as polarization changing means. The direction of polarization of the linearly polarized light is adjusted when the polarizing member 201 is moved in directions indicated by bidirectional arrow 202 by the polarizing member controller 14.

Figure 10:
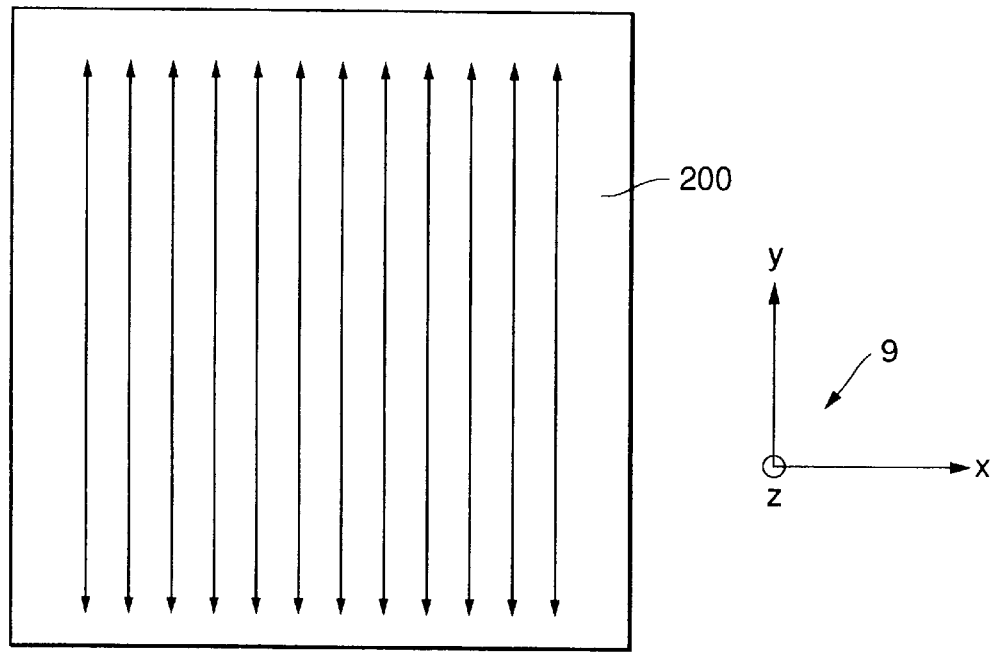
FIG. 10 illustrates a polarizing plate shown in FIG. 9.

FIG. 10 illustrates the polarizing plate 200.

The polarizing plate 200 has the function of converting an incident ray into a linearly polarized light in the y direction.

Figure 11:
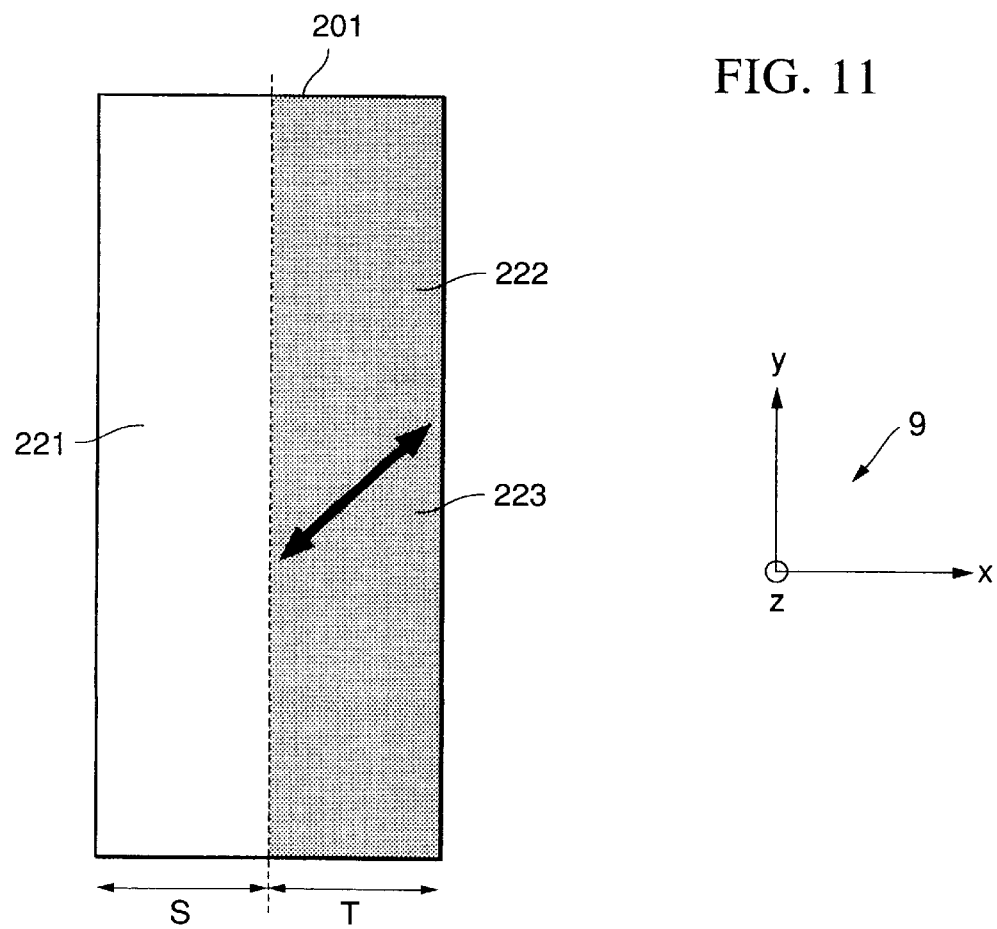
FIG. 11 illustrates a polarization changing member shown in FIG. 9.

Next, the polarizing member 201 will be described with reference to FIG. 11.

Although the polarizing member 201 is uniform in the y direction, it is divided into two areas 221 and 222 (called areas S and T, respectively) in the x direction.

The area S is made of glass, and transmits the linearly polarized light in the y direction, obtained by the polarizing plate 200, without changing the direction of polarization, i.e., as the linearly polarized light in the y direction.

The area T is made of a λ/2 plate having a principal axis in the directions indicated by a bidirectional arrow 223. Thus, the linearly polarized light in the y direction, incident on the area T, emits the area T as a light whose direction of polarization is rotated by 90 degrees, i.e., as a light linearly polarized in the x direction.

The operation of the second embodiment in which the reticle 1 having circuit patterns shown in FIG. 2 is employed will now be described.

FIG. 12 illustrates the relative positional relation between the reticle 1 which is being moved and the polarizing member 201.

Figure 12A:
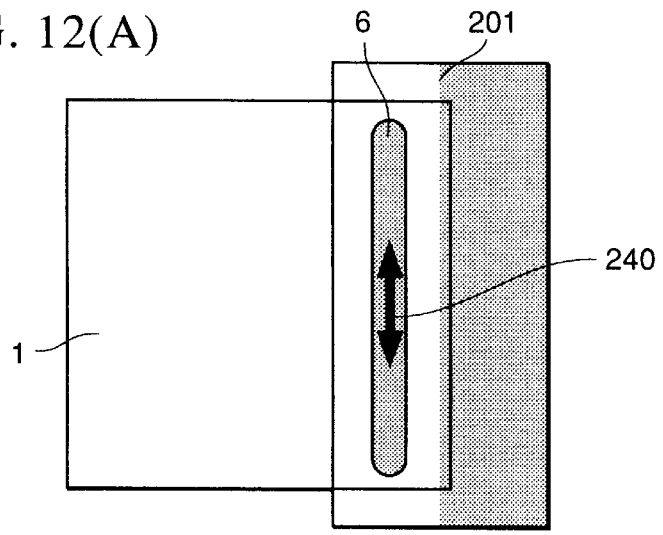
FIGS. 12(A) to 12(C) illustrate the operation of the second embodiment shown in FIG. 9.

FIG. 12(A) illustrates a state obtained immediately after scanning is started. The pattern on the area A shown in FIG. 2 is illuminated with the slit-like illumination ray 6. Since the resolution of the pattern in the area A is improved by the linearly polarized light in the y direction, a linearly polarized light 240 in the y direction is obtained by moving the polarizing member 201 to the right so that the area S of the polarizing member 201 can be superimposed on the illumination ray 6.

Figure 12B:
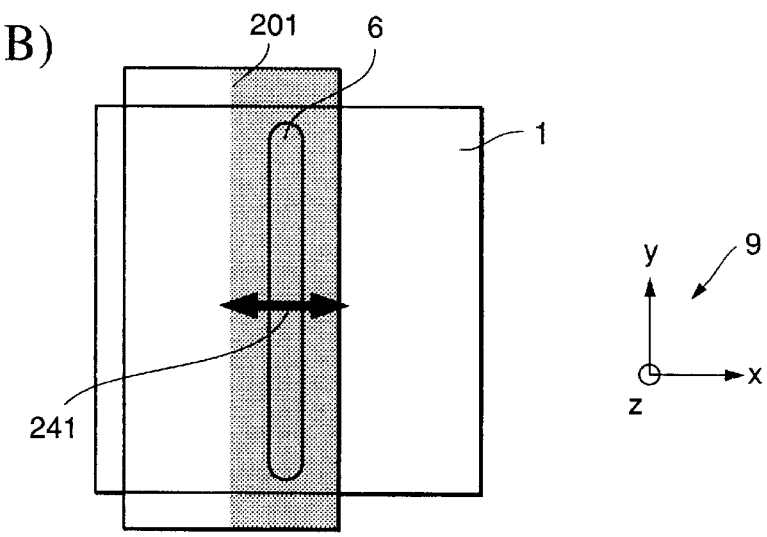

As scanning progresses, the pattern on the area B of the reticle 1 is illuminated, as shown in FIG. 12(B). At that time, since the resolution of the pattern in the area B is improved by the linearly polarized light in the x direction, a linearly polarized light 241 in the x direction is obtained by moving the polarizing member 201 to the left so that the area T of the polarizing member 201 can be superimposed on the illumination ray 6.

Figure 12C:
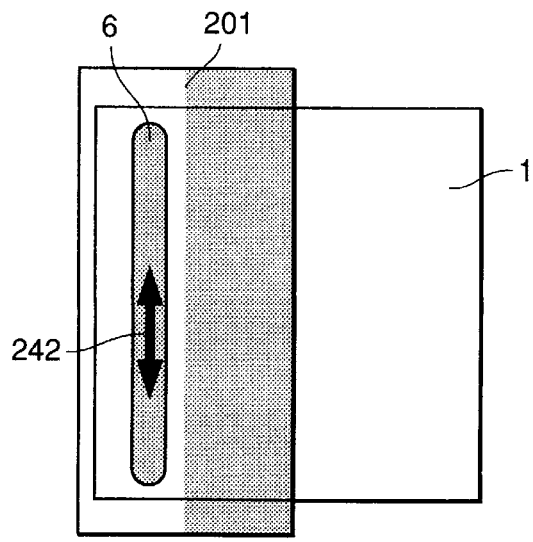

As scanning progresses, the pattern on the area C of the reticle 1 is illuminated, as shown in FIG. 12(C). At that time, since the resolution of the pattern in the area C is improved by the linearly polarized light in the y direction, a linearly polarized light 242 in the y direction is obtained by moving the polarizing member 201 to the right again so that the area S of the polarizing member 201 can be superimposed on the illumination ray 6.

The optimum polarized state for the pattern on each of the areas of the reticle 1 is obtained and the resolution is thereby improved by repeating the above-described series of operations.

While the polarizing member 201 is provided in this embodiment in advance of the reticle 1, i.e., between the illumination system 5 and the reticle 1, alternate embodiments might include a polarizing member 201 provided between the reticle 1 and the projection lens 2, within the projection lens 2 or between the projection lens 2 and the wafer 3.

In a structure in which the polarizing member 201 is disposed between the projection lens 2 and the wafer 3, even if a polarization beam splitter or the like is disposed in the projection lens 2 and there is a limitation to the direction of polarization of the light ray which transmits the projection lens 2, a light ray having an optimum polarizing direction can be obtained when an image is formed on the wafer 3 by adjusting the direction of the polarizing member 201.

While the polarizing plate 200 is provided in this embodiment immediately after the illumination system 5, it may be provided at any position so long as its position is between the illumination system 5 and the wafer 3 and closer to the illumination system 5 than the polarizing member 201.

Figure 7:
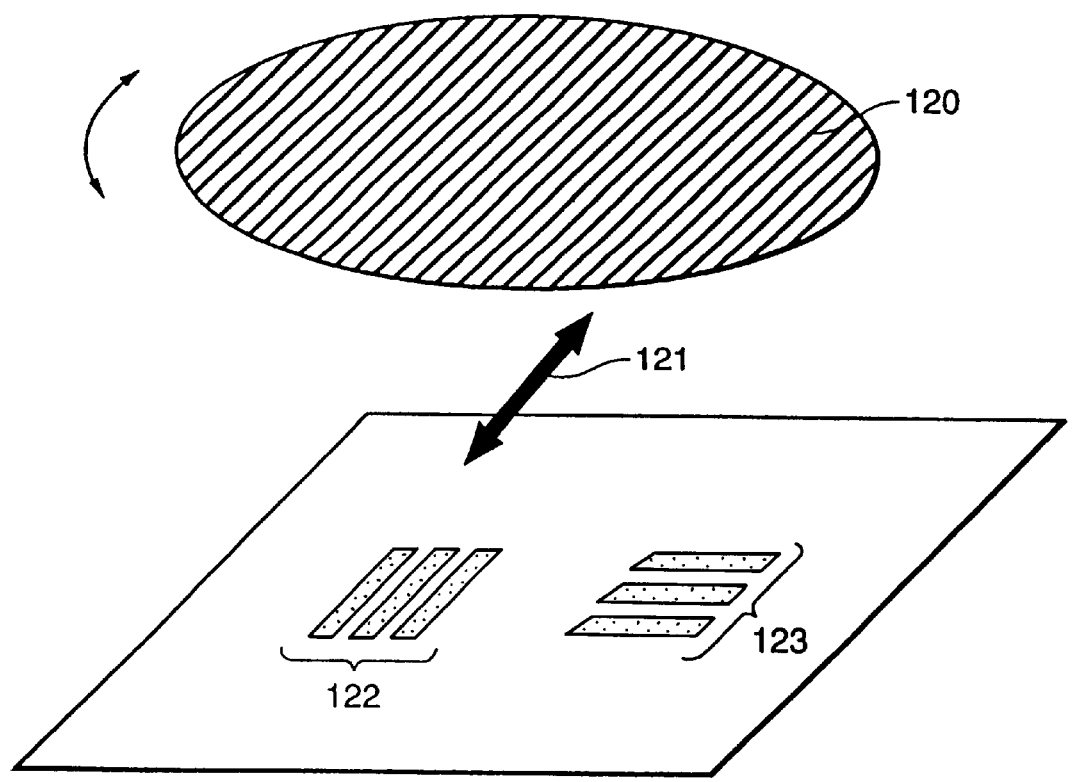
FIG. 7 illustrates a polarizing plate provided in a conventional illumination system.

While the polarizing member 201 is shown as having the area S which does not change the direction of polarization of the linearly polarized light ray incident thereon, the area S may be replaced by air, i.e., no member may be provided in place of the area S. Further, to change the direction of polarization of the illumination light, a polarizing plate 200 constructed in such a manner as to be rotatable may be provided to replace the polarizing member 201, as shown in FIG. 7. At that time, the polarizing plate 200 may be located above the wafer 3 at any position.

In each of the above-described embodiments, a cylindrical lens may be employed to obtain a slit-shaped illumination ray.

An embodiment of a method of manufacturing devices employing the above-described projection exposure apparatus will be described below.

Figure 13:
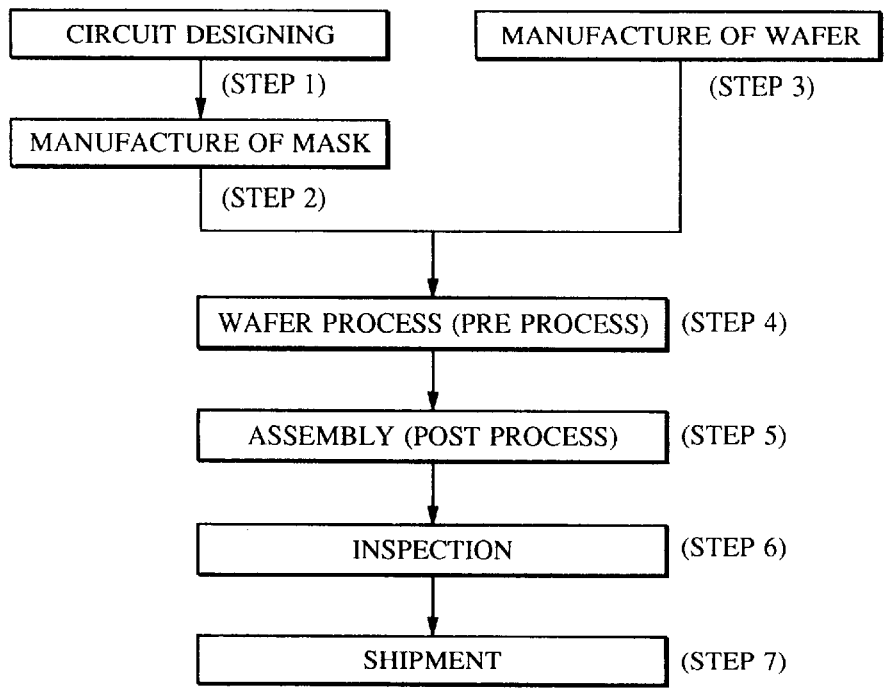
FIG. 13 is a flowchart of a method of manufacturing devices according to the present invention.

FIG. 13 shows the flow of manufacture of a semiconductor device (a semiconductor chip, such as an IC or an LSI, a liquid crystal panel or a CCD).

In step 1 (circuit designing), circuit designing of the semiconductor devices is performed. In step 2 (manufacture of a mask), a mask on which the designed circuit pattern is formed is manufactured. In step 3 (manufacture of a wafer), a wafer is manufactured using a material, such as silicon. In step 4 (wafer process) called the pre process, a circuit is formed on the wafer by the lithographic process using the prepared mask and wafer.

Next, in step 5 (assembly) called the post process, a semiconductor chip is fabricated using the wafer manufactured in step 4. Step 5 includes an assembly process (dicing and bonding), a packaging process (chip sealing) and so on. In step 6 (inspection), inspections, such as the operation checking test and endurance test of the semiconductor devices manufactured in step 5, are conducted. The semiconductor devices manufactured through the above processes are shipped (step 7).

Figure 14:
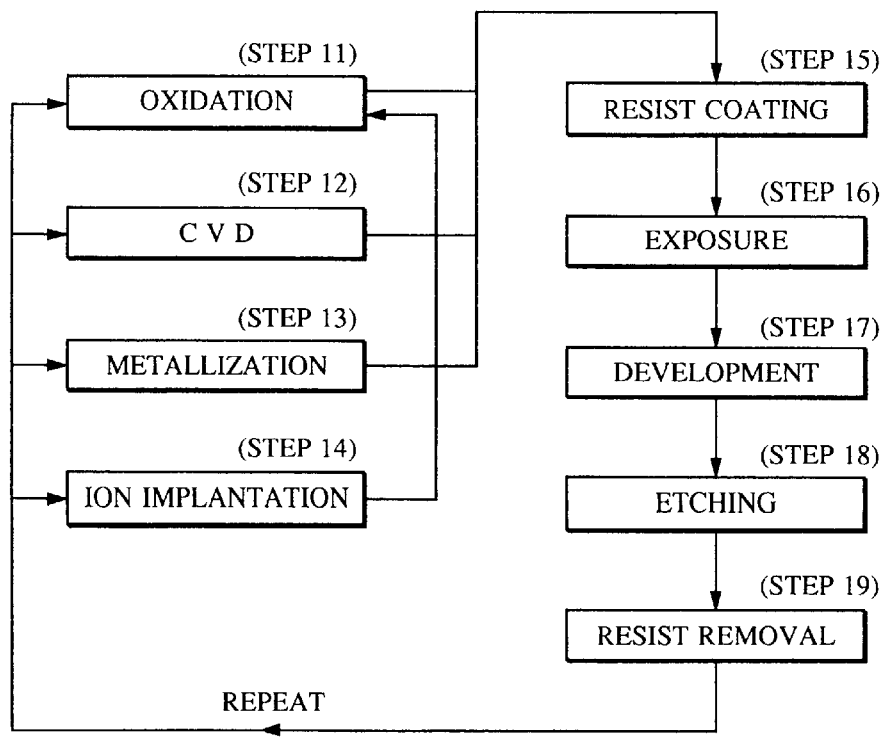
FIG. 14 is a flowchart of the wafer process in FIG. 13.

FIG. 14 shows the flow of the wafer process. In step 11 (oxidation), the surface of the wafer is oxidized. In step 12 (CVD), an insulator film is formed on the surface of the wafer.

In step 13 (metallization), the wafer is metallized by evaporation. In step 14 (ion implantation), ions are implanted into the wafer. In step 15 (resist coating), a photosensitive agent is coated on the wafer. In step 16 (exposure), the circuit patterns on the mask are transferred onto the wafer using the above-described exposure apparatus. In step 17 (development), the exposed wafer is developed. In step 19 (resist removal), the unnecessary resist is removed. A multiple circuit pattern is formed on the wafer by repeating the above-described steps.

It is possible according to the manufacturing method of the present invention to readily manufacture devices having a high complexity which would be difficult to manufacture conventionally.

What is claimed is:

1. A projection exposure apparatus comprising:

scanning means for scanning a mask and a substrate relative to an exposure beam in a scanning direction, with the exposure beam having a direction of polarization, said mask containing at least first and second patterns, with said first pattern extending in a different longitudinal direction than said second pattern, and said first and second patterns being formed at different positions with respect to the scanning direction; and polarization changing means for changing the direction of polarization of the exposure beam during said scanning operation so that each of said first and second patterns is exposed to a polarized light beam which is polarized in the same direction as the longitudinal direction of the pattern.

2. The projection exposure apparatus according to claim 1, wherein said polarization changing means changes the direction of polarization of the exposure beam immediately before said mask.

3. The projection exposure apparatus according to claim 2, further comprising an illumination optical system for emitting the exposure beam to illuminate said mask, wherein said illumination optical system includes said polarization changing means.

4. The projection exposure apparatus according to claim 2, further comprising an illumination optical system for emitting the exposure beam to illuminate said mask, wherein said polarization changing means changes the direction of polarization of the exposure beam between said illumination optical system and said mask.

5. The projection exposure apparatus according to claim 1, wherein said polarization changing means changes the direction of polarization of the exposure beam between said mask and said substrate.

6. The projection exposure apparatus according to claim 5, further comprising a projection optical system for projecting a pattern of said mask onto said substrate, wherein said polarization changing means changes the direction of polarization of the exposure beam within said projection optical system.

7. The projection exposure apparatus according to claim 5, further comprising a projection optical system for projecting a pattern of said mask onto said substrate, wherein said polarization changing means changes the direction of polarization of the exposure beam between said projection optical system and said mask.

8. The projection exposure apparatus according to claim 5, further comprising a projection optical system for projecting a pattern of said mask onto said substrate, wherein said polarization changing means changes the direction of polarization of the exposure beam between said projection optical system and said wafer.

9. The projection exposure apparatus according to claim 1, wherein said polarization changing means includes a polarizing plate and a movable ½ wavelength plate.

10. The projection exposure apparatus according to claim 1, wherein said polarization changing means includes a polarizing plate.

11. The projection exposure apparatus according to claim 1, wherein said polarization changing means includes a movable member having a plurality of polarizing plates whose direction of polarization differs from each other.

12. A method of manufacturing devices comprising the steps of:

providing a mask containing at least first and second patterns and a substrate, with the first pattern extending in a different longitudinal direction than the second pattern, and the first and second patterns being formed at different positions with respect to a scanning direction;

scanning the mask and the substrate in a scanning operation such that the mask and the substrate are moved relative to an exposure beam in the scanning direction, with the exposure beam having a direction of polarization; and changing the direction of polarization of the exposure beam during the scanning operation so that each of the first and second patterns is exposed to a polarized light beam which is polarized in the same direction as the longitudinal direction of the pattern.

13. The method according to claim 12, further comprising the step of changing the direction of polarization of the exposure beam immediately before said mask.

14. The method according to claim 13, further comprising the step of providing an illumination optical system for emitting the exposure beam to illuminate the mask; and changing the direction of polarization of the exposure beam within said illumination optical system.

15. The method according to claim 13, further comprising the step of providing an illumination optical system for emitting th e exposure be am t o illuminate said mask, and changing the direction of polarization of the exposure beam between said illumination optical system and said mask.

16. The method according to claim 12, further comprising the step of changing the direction of polarization of the exposure beam between said mask and said substrate.

17. The method according to claim 16, further comprising the step of providing a projection optical system for projecting a pattern of said mask onto said substrate, and changing the direction of polarization of the exposure beam within said projection optical system.

18. The method according to claim 16, further comprising the step of providing a projection optical system for projecting a pattern of said mask onto said substrate, and changing the direction of polarization of the exposure beam between said projection optical system and said mask.

19. The method according to claim 16, further comprising the step of providing a projection optical system for projecting a pattern of said mask onto said substrate, and changing the direction of polarization of the exposure beam between said projection optical system and said wafer.

20. The method according to claim 12, further including the step of providing a polarizing plate and a movable ½ wavelength plate for changing the direction of polarization of the exposure beam.

21. The method according to claim 12, further comprising the step of providing a polarizing plate for changing the direction of polarization of the exposure beam.

22. The method according to claim 12, further comprising the step of providing a movable member having a plurality of polarizing plates whose direction of polarization differs from each other for changing the direction of polarization of the exposure beam.

* * * * *

UNITED STATES PATENT AND TRADEMARK OFFICE
CERTIFICATE OF CORRECTION

PATENT NO. : 5,933,219

DATED : August 3, 1999

INVENTOR(S): Yasuyuki Unno

It is certified that error appears in the above-identified patent and that said Letters Patent is hereby corrected as shown below:

COLUMN 10:

Line 27, "th e" should read --the--, and "be am t o" should read --beam to--.

Signed and Sealed this

Ninth Day of May, 2000

Attest:

Attesting Officer

Q. TODD DICKINSON
Director of Patents and Trademarks